(12) United States Patent
Muhammad et al.

(10) Patent No.: US 7,639,082 B2
(45) Date of Patent: Dec. 29, 2009

(54) SYSTEM AND METHOD FOR AMPLIFIER GAIN MEASUREMENT AND COMPENSATION

(75) Inventors: Khurram Muhammad, Dallas, TX (US); Dirk Leipold, Obserschan (CH); Chandana Fernando, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/847,961

(22) Filed: Aug. 30, 2007

(65) Prior Publication Data

US 2009/0027127 A1 Jan. 29, 2009

Related U.S. Application Data

(60) Provisional application No. 60/951,559, filed on Jul. 24, 2007.

(51) Int. Cl.
*H03F 3/04* (2006.01)
(52) U.S. Cl. .............. 330/289; 330/278; 330/2
(58) Field of Classification Search ........... 330/289, 330/278, 2
See application file for complete search history.

(56) References Cited

U.S. PATENT DOCUMENTS

| | | | |
|---|---|---|---|
| 4,396,891 A | 8/1983 | Johansson et al. | |
| 4,715,003 A | 12/1987 | Keller et al. | |
| 4,929,908 A | 5/1990 | Imanishi | |
| 5,576,662 A | 11/1996 | Price et al. | |
| 5,668,506 A | 9/1997 | Watanabe et al. | |
| 5,742,203 A | 4/1998 | Van De Plassche et al. | |
| 5,994,970 A | 11/1999 | Cole et al. | |
| 6,160,458 A | 12/2000 | Cole et al. | |
| 6,271,726 B1 | 8/2001 | Fransis et al. | |
| 6,480,061 B2* | 11/2002 | Dolman et al. | 330/2 |
| 6,677,823 B2* | 1/2004 | Terosky et al. | 330/289 |
| 6,812,771 B1 | 11/2004 | Behel et al. | |
| 7,006,813 B2 | 2/2006 | Staszewski et al. | |
| 7,061,325 B2 | 6/2006 | Pitz | |
| 7,120,393 B2* | 10/2006 | Behzad et al. | 455/73 |
| 7,167,045 B1* | 1/2007 | Son et al. | 330/130 |
| 7,356,102 B2* | 4/2008 | Morton et al. | 375/345 |
| 2003/0040294 A1 | 2/2003 | Staszewski et al. | |
| 2008/0061872 A1* | 3/2008 | Hughes | 330/86 |

* cited by examiner

*Primary Examiner*—Patricia Nguyen
(74) *Attorney, Agent, or Firm*—Ronald O. Neerings; Wade James Brady, III; Frederick J. Telecky, Jr.

(57) ABSTRACT

A system and method for amplifier gain measurement and compensation. A method for compensating a signal gain of an amplifier circuit includes determining a desired gain for the amplifier circuit, determining an operating temperature of the amplifier circuit, adjusting a set of signal gains based on the operating temperature to produce a set of adjusted signal gains, determining a desired gain setting based on the desired gain and the set of signal gains, and providing the desired gain setting to the amplifier circuit.

20 Claims, 5 Drawing Sheets

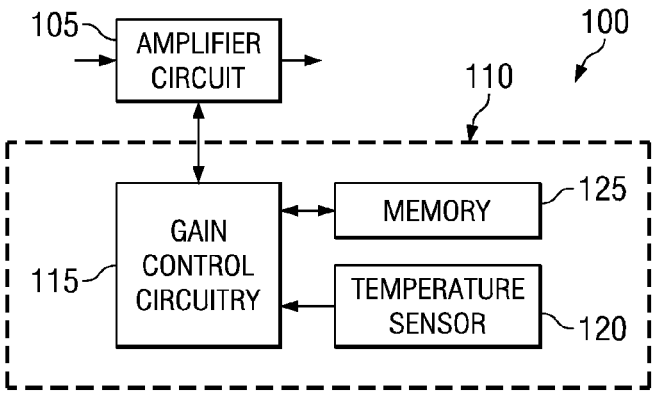
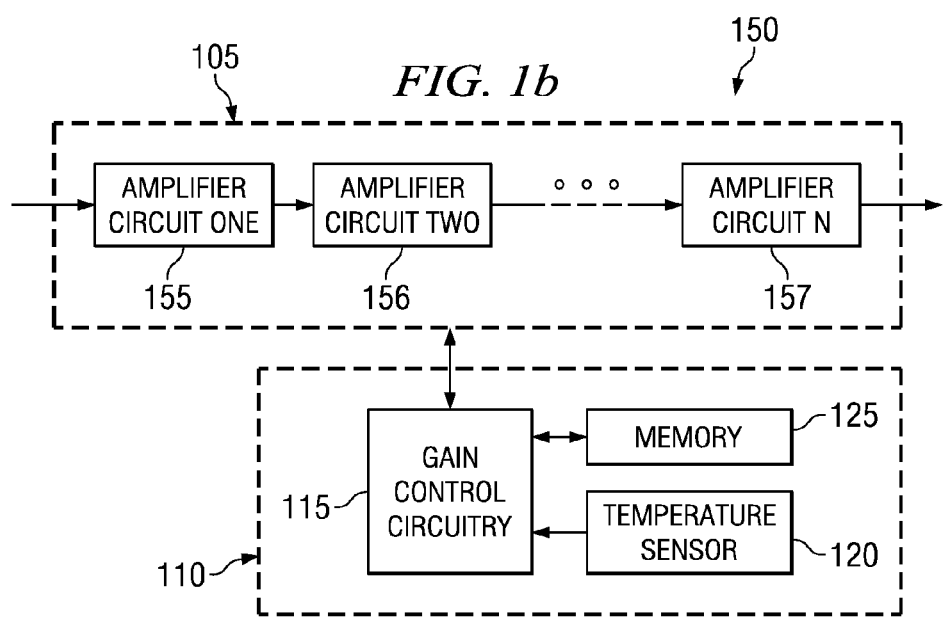
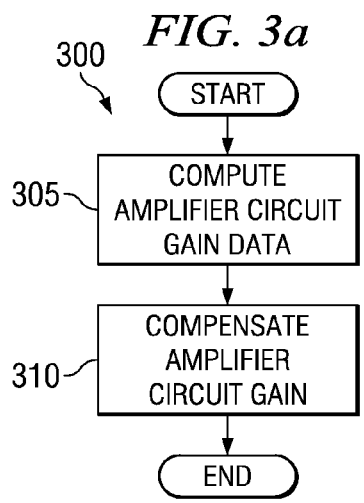
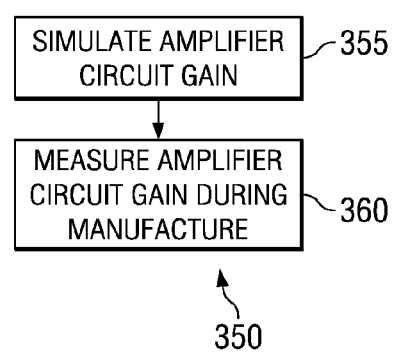

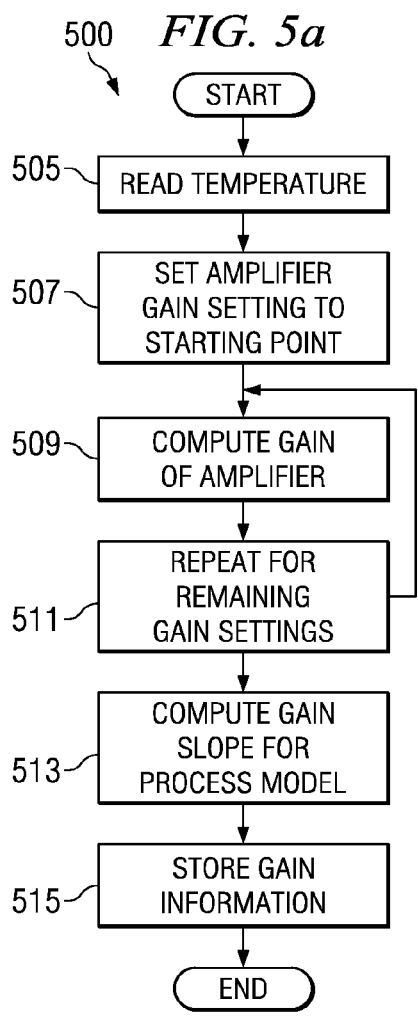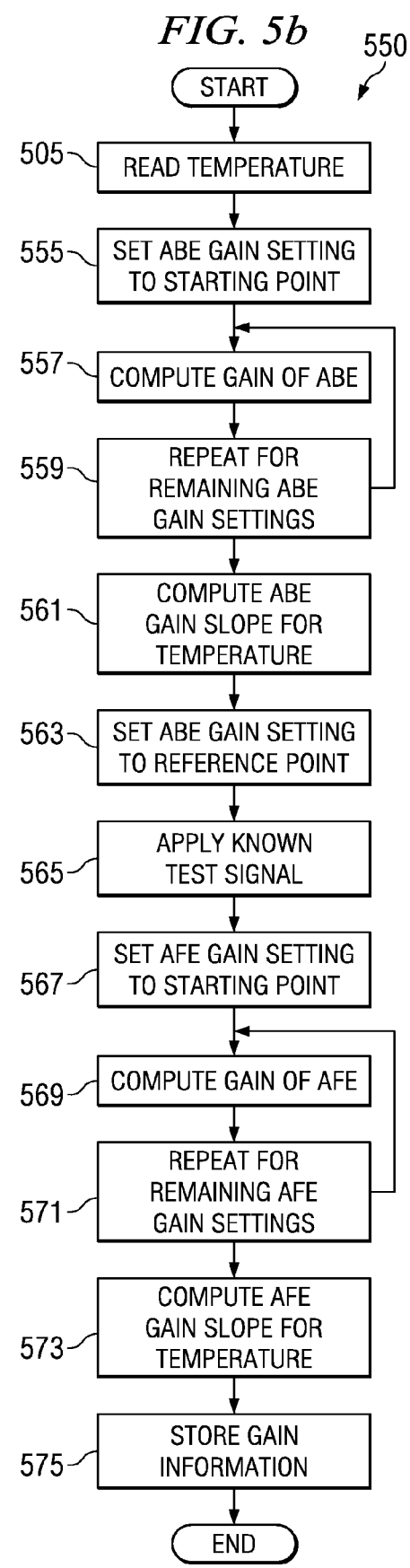

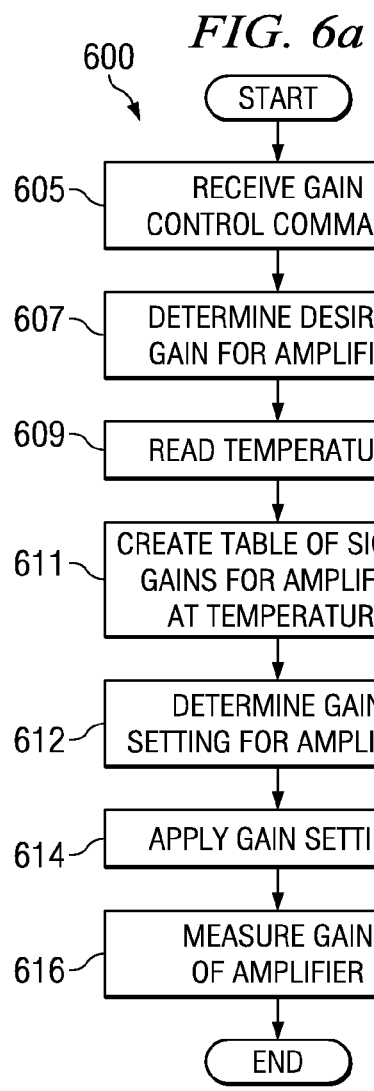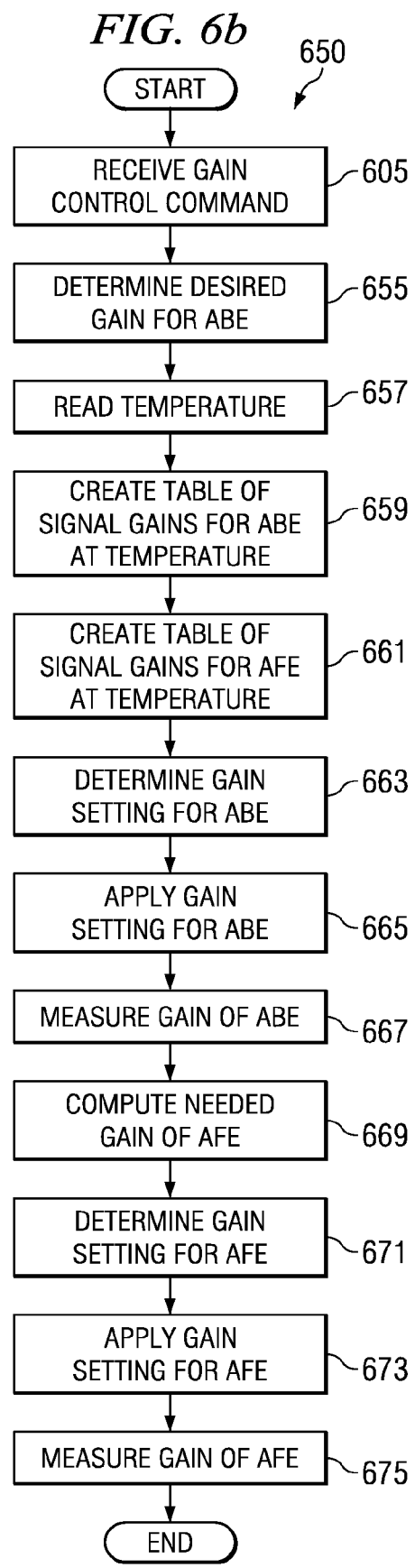

SYSTEM AND METHOD FOR AMPLIFIER GAIN MEASUREMENT AND COMPENSATION

This application claims the benefit of U.S. Provisional Application No. 60/951,559, filed on Jul. 24, 2007, entitled "A Method of Amplifier Gain Measurement and Compensation Using a Temperature Sensor and a General Purpose Processor," which application is hereby incorporated by reference.

TECHNICAL FIELD

The present invention relates generally to a system and method for signal processing, and more particularly to a system and method for amplifier gain measurement and compensation.

BACKGROUND

A signal amplifier may be designed to provide a specified amount of gain or a specified range of gains. Furthermore, there may be a specified permissible amount of gain variation for a signal amplifier. In general, the gain variation present in a signal amplifier may be due to manufacturing process variations, differences in operating temperature, and so forth. Therefore, to help ensure that a signal amplifier provides an expected amount of gain, tracking and compensation circuits may be used. Typically, the tracking and compensation circuits may be analog in nature. Additionally, each signal amplifier may require dedicated tracking and compensation circuits.

The analog tracking and compensation circuits may typically be designed alongside the signal amplifier and may be fabricated on the same substrate as the signal amplifier. Therefore, the performance of the analog tracking and compensation circuits may be only as good as the accuracy of device models of the manufacturing process. Should the device models later prove to be inaccurate, the analog tracking and compensation circuits may not perform well and may need to be redesigned.

Furthermore, since each signal amplifier in a circuit may need its own analog tracking and compensation circuit, circuits with a large number of signal amplifiers or circuits fabricated with limited substrate area may have to dedicate a significant amount of substrate area to the analog tracking and compensation circuits. Additionally, the analog tracking and compensation circuits may consume a considerable amount of power, which may pose a problem in low-power applications, such as portable electronic devices.

SUMMARY OF THE INVENTION

These and other problems are generally solved or circumvented, and technical advantages are generally achieved, by embodiments of a system and a method for amplifier gain measurement and compensation.

In accordance with an embodiment, a method for calibrating a signal gain of an amplifier circuit is provided. The method includes determining an operating temperature of the amplifier circuit, setting the amplifier circuit to an initial gain setting, determining an initial signal gain of the amplifier, repeating the setting and the determining of a signal gain for remaining gain settings of the amplifier circuit to determine a signal gain for each gain setting, and computing a gain slope for each gain setting.

In accordance with another embodiment, a method for compensating a signal gain of an amplifier circuit is provided. The method includes determining a desired gain for the amplifier circuit, determining an operating temperature of the amplifier circuit, adjusting a set of signal gains based on the operating temperature to produce a set of adjusted signal gains, determining a desired gain setting based on the desired gain and the set of adjusted signal gains, and providing the desired gain setting to the amplifier circuit.

In accordance with another embodiment, a circuit with signal gain compensation is provided. The circuit includes a temperature sensor to provide an operating temperature of the circuit, an amplifier circuit to amplify a signal provided by a signal input by an amount controllable by a control input, a gain control circuit coupled to the amplifier circuit and to the temperature sensor, and a memory coupled to the gain control circuit. The gain control circuit compensates for changes in a signal amplification factor of the amplifier due to changes in operating temperature using adjusted signal amplification factor data based on the operating temperature and signal amplification factor data generated during calibration of the circuit, and the memory stores the signal amplification factor data and the adjusted signal amplification factor data.

An advantage of an embodiment is that an accurate device model is not required while implementing the embodiment since gain variation data may be measured after the manufacture of the signal amplifiers. Therefore, good gain variation tracking and compensation may be achieved for new manufacturing processes that do not have accurate device models.

A further advantage of an embodiment is that digital gain variation tracking and compensation may be achieved with a small investment in substrate real estate that may be relatively independent of the number of signal amplifiers in a circuit. Digital processing may make use of digital baseband processing hardware already present in many applications, thereby decreasing the amount of additional hardware needed to implement the embodiments.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1a is a diagram of a high-level view of an electronic device, wherein the electronic device includes an amplifier circuit;

FIG. 1b is a diagram of a high-level view of an electronic device, wherein the electronic device includes a plurality of amplifier circuits;

FIG. 3a is a diagram of a sequence of events in digitally controlling the gain variation of a circuit;

FIG. 3b is a diagram of a sequence of events in computing amplifier circuit gain data;

FIG. 5a is a diagram of a sequence of events in the computing of amplifier circuit gain data;

FIG. 5b is a diagram of a sequence of events in the computing of amplifier circuit gain data for a receiver;

FIG. 6a is a diagram of a sequence of events in the compensation of signal gain for an amplifier circuit; and FIG. 6b is a diagram of a sequence of events in the compensation of signal gain for a receiver.

DETAILED DESCRIPTION OF ILLUSTRATIVE EMBODIMENTS

Figure 2:
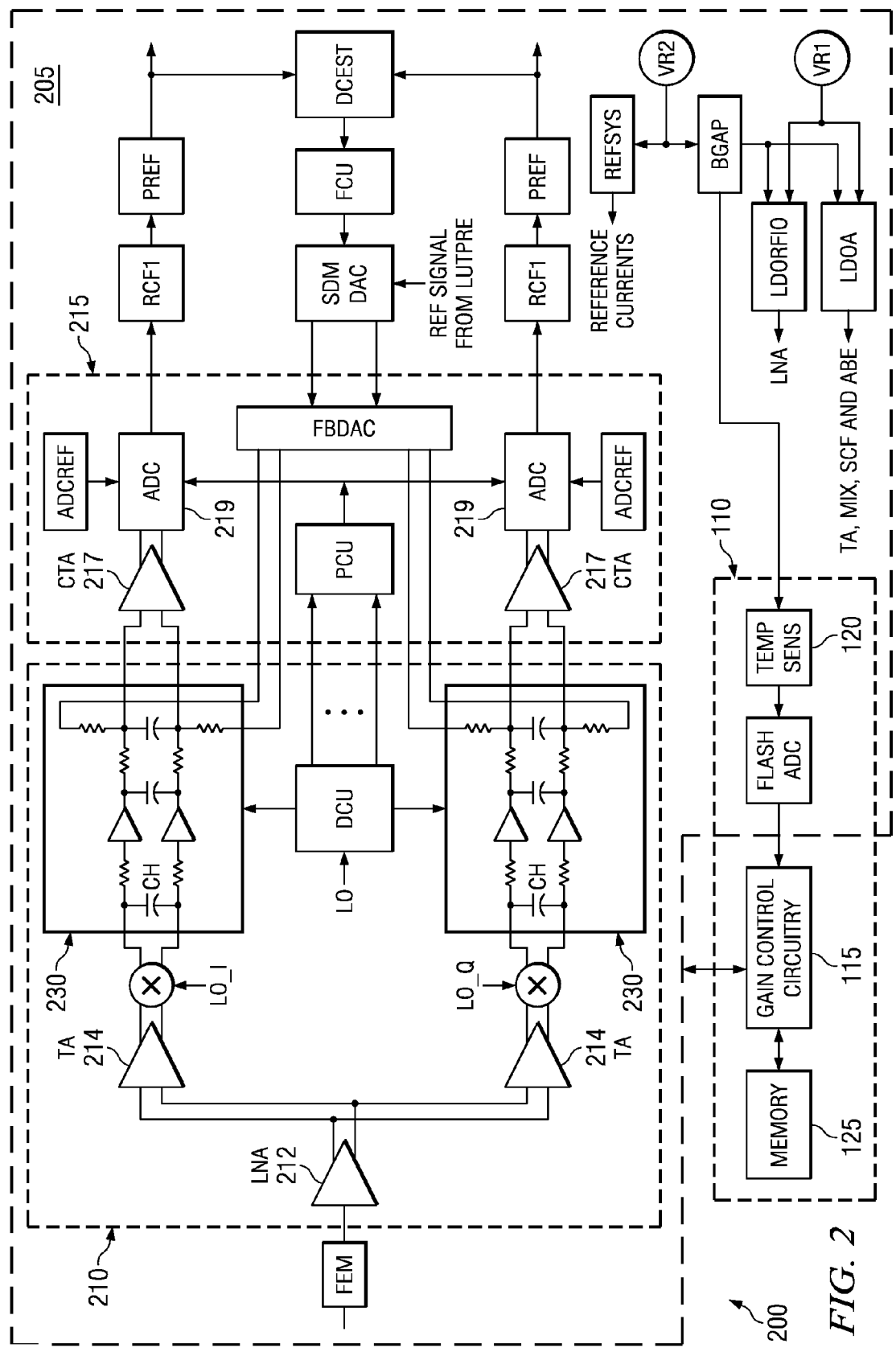
FIG. 2 is a diagram of a wireless communications device.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a wireless receiver for use in a wireless communications device. The invention may also be applied, however, to other circuits containing signal amplifiers, such as transmitters for use in a wireless communications device, as well as any type of circuit containing signal amplifiers wherein there is a desire to control gain in the signal amplifiers.

FIG. 1a illustrates a high-level view of an electronic device 100, wherein the electronic device 100 includes an amplifier circuit 105. Although referred to as an amplifier circuit, the amplifier circuit 105 may have embedded filtering. The electronic device 100 includes a digital gain variation control circuit 110 that may be used to control signal gain produced by the amplifier circuit 105 so that the electronic device 100 produces a desired amount of signal gain. The digital gain variation control circuit 110 may include gain control circuitry 115, a temperature sensor 120, and a memory 125. The gain control circuitry 115 may include a processing element, a processor, custom designed integrated circuits, and so forth, that may be used to provide computation power needed to compute signal amplifier gain slopes, gain compensation values, interpolated gain values, adjust gain values based on temperature, and so forth.

The gain control circuitry 115 may have a dedicated processor or it may share a processing element, processor, custom designed integrated circuit, and so forth, already present in the electronic device 100. For example, in many electronic devices, there may already be a processing element or similar element available in the electronic device. The gain control circuitry 115 may then be able to make use of the available processing element to perform the needed computations. This may reduce the complexity and the cost of the digital gain variation control circuit 110.

The gain control circuitry 115 may obtain temperature readings from the temperature sensor 120 and compute adjustments to signal amplifier gain information stored in the memory 125. Again, the electronic device 100 may already include the temperature sensor 120. Furthermore, the electronic device 100 may have sufficient memory storage available so that the gain control circuitry 115 may not need its own dedicated memory. Therefore, depending on the nature of the electronic device 100, the digital gain variation control circuit 110 may require a minimum investment in additional hardware. However, if the electronic device 100 includes a large number of amplifier circuits 105, the digital gain variation control circuit 110 may include its own dedicated processing element and memory 125 to help avoid overtaxing the electronic device's own processing element and memory.

FIG. 1b illustrates an electronic device 150, wherein the amplifier circuit 105 includes N separate amplifier circuits, such as amplifier circuit one 155, amplifier circuit two 156, and amplifier circuit N 157. The digital gain variation control circuit 110 may control the gain of each amplifier circuit. If the amplifier circuit 105 includes amplifier circuits that are arranged in parallel, then each parallel arrangement of amplifier circuit(s) may be considered an independent amplifier circuit. Independent amplifier circuits may have its signal gain calibrated and compensated in parallel. If the amplifier circuit 105 contains amplifier circuits that are arranged serially, then each serial sequence of amplifier circuits may need to be considered as a single amplifier circuit, and must be processed accordingly.

Digital control of gain variation may have several advantages over analog control techniques, such as feedback control loops and resistive networks, since accurate device models of the manufacturing processes used to create the amplifier circuit 105 may not be needed. Device models may be utilized to pre-compute gain values for various gain settings as well as gain variation over temperature. Then, after manufacture, actual measurements of circuitry may be performed to verify the accuracy of the gain computations made using the device models. If the measured gain values differ significantly from the computed gain values, then the computed gain values may be replaced with the measured gain values. With analog control techniques, if the device models are determined to be inaccurate after manufacture, then a redesign of the analog control techniques may be required. Additionally, with analog control techniques, each amplifier circuit in the electronic device 100 may require its own analog control circuit, whereas with the digital control of gain variation, a single digital control circuit may be sufficient to control the gain variation of the entire electronic device 100.

FIG. 2 illustrates a block level view of a portion of a wireless communications device 200. The wireless communications device 200 includes a receiver 205 that may be used to receive transmissions transmitted wirelessly over-the-air. The wireless communications device 200 also includes the gain control circuitry 115 that may be used to digitally control gain variation in amplifiers contained in the receiver 205. The memory 125 may be used to store gain information, such as gain variation over temperature, gain values, and so forth.

The receiver 205 includes several amplifier circuits, each amplifier circuit containing several signal amplifiers. A first amplifier circuit referred to as an analog-front-end (AFE) 210 may include a low noise amplifier (LNA) 212 and a transconductance amplifier (TA) 214. The AFE 210 may contain more than one TA 214, with one TA 214 assigned to either an in-phase or an out-of-phase quadrature. A second amplifier circuit referred to as an analog-back-end (ABE) 215 may include a continuous time amplifier (CTA) 217 and an analog-to-digital converter (ADC) 219 for the in-phase and out-of-phase quadratures, respectively. A typical receiver may be partitioned into an AFE and an ABE with a line of demarcation usually being a point after a mixer, such as a multi-tap direct sampling mixer (MTDSM) 230.

The implementation of the ABE 215 shown in FIG. 2 may enable the ABE 215 to generate its own test signal with known magnitude and/or frequency. Then, an output of the ABE 215 may be measured. The implementation of the AFE 210 may require that a test signal of known magnitude may be injected from an external source. Additionally, it may not be possible to directly measure an output of the AFE 210. Rather, to determine the output of the AFE 210, the output of the ABE 215 may need to be measured and then the output of the AFE 210 may be computed from the measured output of the ABE 215. The gain measurement ability of the ABE 215 enables the partitioning of the receiver 205 into two amplifier circuits. It may possible to model the receiver 205 as a single amplifier circuit and perform the digital gain variation control of the receiver 205 as the single amplifier circuit.

The receiver 205 also includes a temperature sensor 120 that may be used to provide measurements of the operating temperature of the wireless communications device 200 in general, and the receiver 205 in particular. The temperature measurement from the temperature sensor 120 may be digitized and provided to the gain control circuitry 115, which may then utilize the temperature measurement to adjust the gain of the various signal amplifiers in the receiver 205 to ensure that the gain of the receiver 205 is about equal to an expected gain. The combination of the gain control circuit 115, the memory 125, and the temperature sensor 120 may form the digital gain variation control circuit 110.

FIG. 3a illustrates a sequence of events 300 in digitally controlling the gain variation of a circuit. The sequence of events 300 may begin with a computing of amplifier circuit gain data (block 305). The computing of amplifier gain data may involve the computing of amplifier gain data at an operating temperature for each amplifier circuit in the circuit. For example, referencing the receiver 205 shown in FIG. 2, the computing of amplifier gain data may involve the computing of amplifier gain data for the ABE 215 and the AFE 210, potentially including individually computable amplifiers within the amplifier circuits, including the CTA 217. For amplifier circuits wherein the gain of individual amplifiers may not be computed, the gain for the entire amplifier circuit may be computed, for example, the AFE 210.

The computing of the amplifier gain data may be achieved through simulation techniques utilizing a device model of the fabrication process of the amplifier circuits. Alternatively, the computing of the amplifier gain data may be achieved through direct measurements of the amplifier circuits during a manufacturing process. The computing of the amplifier gain data may include the computation of the amplifier gain data using both the simulation techniques and the direct measurement techniques.

FIG. 3b illustrates a sequence of events 350 in the computing of amplifier circuit gain data. The sequence of events 350 may be an implementation of the computing of the amplifier circuit gain data, block 305 shown in FIG. 3a. The sequence of events 350 may include the simulating of the amplifier circuit gain data (block 355), followed by the measuring of the amplifier circuit gain data during manufacture (block 360). The measured amplifier circuit gain data may be used to verify the accuracy of the simulated amplifier circuit gain data. If the measured amplifier circuit gain data corresponds to the simulated amplifier circuit gain data within an expected error margin, then the simulated amplifier circuit gain data may be used. However, if the measured amplifier circuit gain data differs from the simulated amplifier circuit gain data by more than the expected error margin, the measured amplifier circuit gain data may be used in place of the simulated amplifier circuit gain data since the process models used in the simulation may be inaccurate. After the simulating and the measuring, the amplifier circuit gain data (either the simulated or the measured) may be stored in a memory.

With reference back to FIG. 3a, after computing the amplifier circuit gain data (block 305), the computed amplifier circuit gain data may be used to compensate for gain variations in the amplifier circuits of the circuit (block 310). The compensation for gain variations may make use of an operating temperature of the circuit, which may be provided by a temperature sensor. The temperature sensor may be a circuit that produces an analog output voltage or current that varies with temperature in a predictable manner (i.e., a predictable function of temperature). The output of the temperature sensor may then be converted from analog to digital. This may be followed by an inverse function, converting the digitized voltage or current value back to a temperature value. The inverse function may be implemented in digital or software to produce a digital word expressive of temperature. For example, in a receiver, a temperature of the receiver may be sensed prior to receiving a transmission and in a transmitter, a temperature of the transmitter may be sensed prior to transmitting a transmission.

The compensation for the gain variations may take place periodically, for example, once every specified amount of time expires. Alternatively, the compensation may take place every time an event occurs, for example, prior to a transmission of data, receipt of data, when there is a detected change in the operating temperature of the circuit, when instructed to do so, or so forth.

Figure 4A:
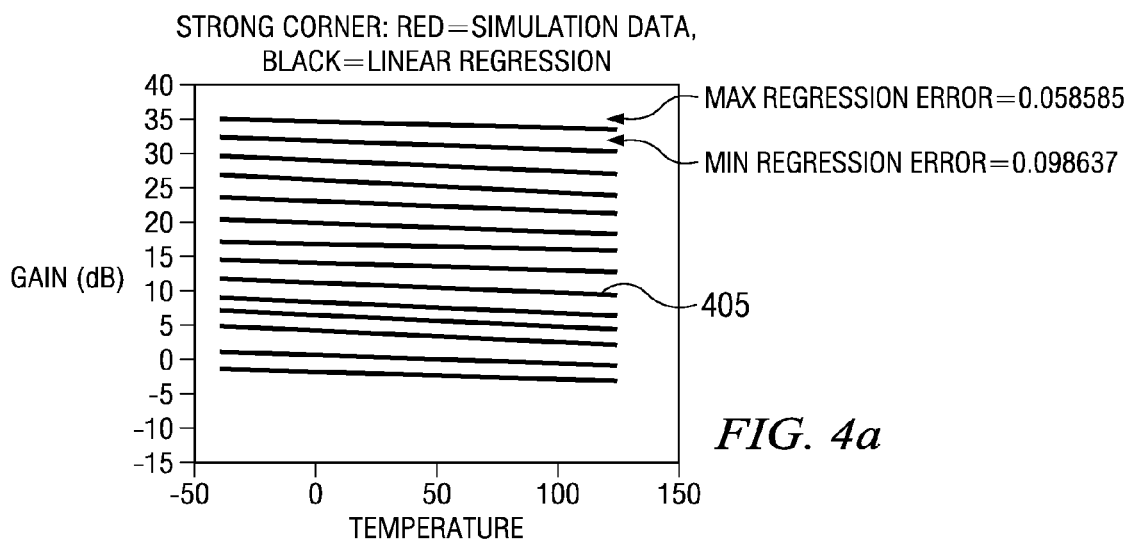
FIGS. 4a through 4c are diagrams of data plots of simulated amplifier gain data for an amplifier using different process models.
Figure 4B:
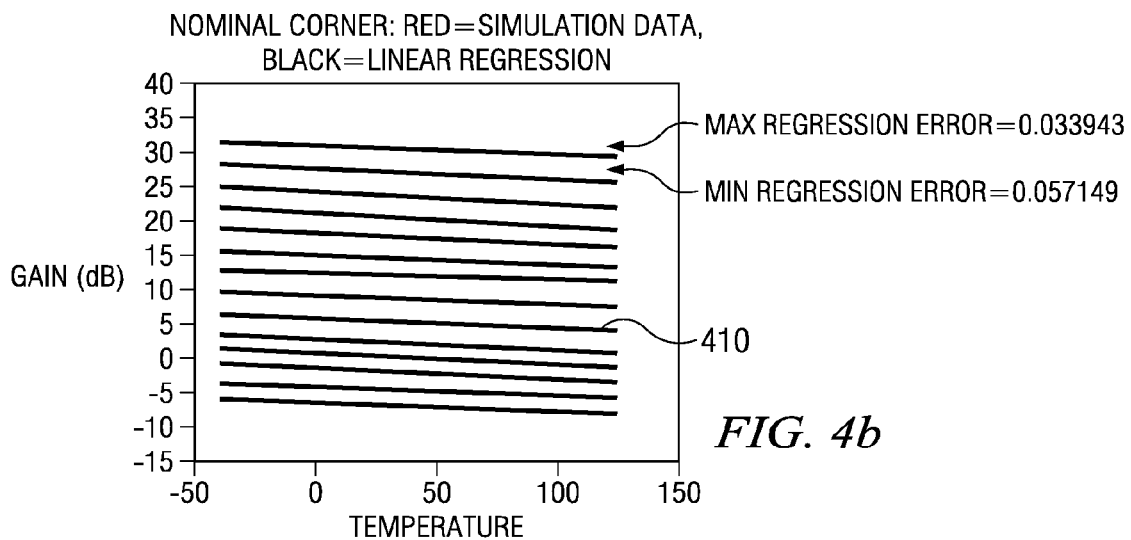
Figure 4C:
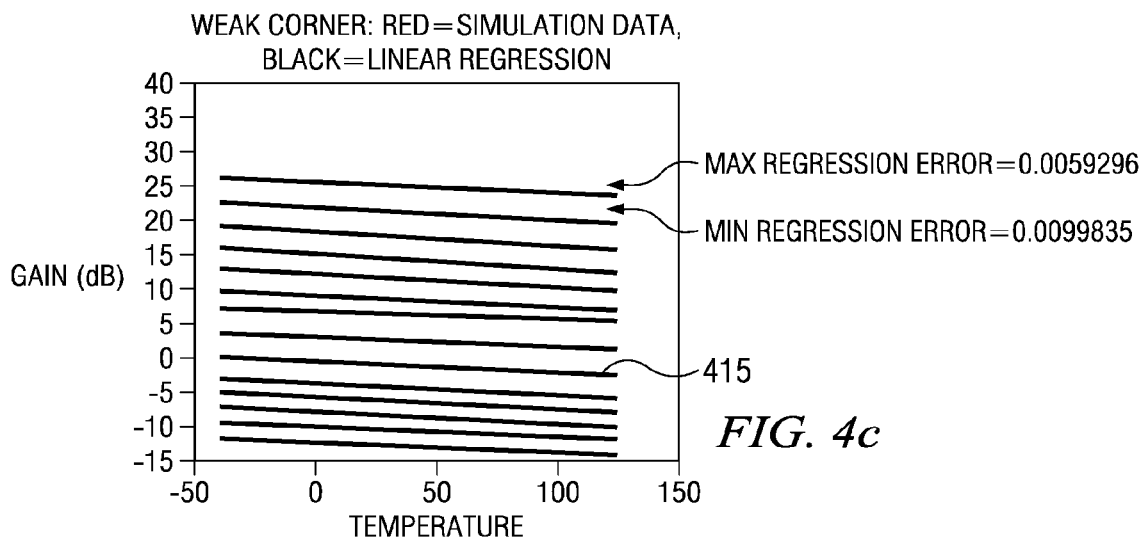

FIGS. 4a through 4c illustrate data plots of simulated amplifier signal gain of the CTA 217 of the receiver 205 versus operating temperature for several different process models. FIG. 4a illustrates simulated amplifier signal gain at a variety of gain settings of the CTA 217, wherein the simulation utilizes a strong corner process model. In general, the simulated amplifier signal gain decreases linearly with increasing temperature. For example, a first trace 405 (with the CTA 217 at a sixth gain setting) starts at about 12 dB at about −40 degrees Celsius and drops to about 10 dB at about 125 degrees Celsius. FIG. 4b illustrates simulated amplifier signal gain at a variety of gain setting of the CTA 217, wherein the simulation utilizes a nominal corner process model. For example, a second trace 410 (with the CTA 217 at a sixth gain setting) starts at about 7 dB at about −40 degrees Celsius and drops to about 4 dB at about 125 degrees Celsius. Similarly, FIG. 4c illustrates simulated amplifier signal gain at a variety of gain setting of the CTA 217, wherein the simulation utilizes a weak corner process model. For example, a third trace 415 (with the CTA 217 at a sixth gain setting) starts at about 0 dB at about −40 degrees Celsius and drops to about −3 dB at about 125 degrees Celsius.

The behavior of the simulated amplifier signal gain versus operating temperature may enable easy modeling of the amplifier signal gain behavior with changing temperature. A linear regression model may be used to fit measured amplifier signal gain data to enable a compensation of the amplifier circuit's gain variation as a function of operating temperature. A general formula for a linear regression model of the amplifier signal gain data may be expressed as:

$$g_k = g_{k,ref} + \alpha_k(T - T_{ref}),$$

where $g_k$ is an amplifier signal gain for gain setting k at temperature T, $g_{k,ref}$ is a reference gain point for gain setting k, $T_{ref}$ is a reference temperature, and $\alpha_k$ is a slope of the amplifier signal gain with respect to temperature. The reference temperature, $T_{ref}$, may be chosen from a variety of different temperatures. For example, a possibility for the reference temperature may a temperature at which calibration is performed for the circuit (the receiver 205 in this discussion) or a temperature used in simulations of the circuit using device models. Other possibilities may be standard room temperature, expected temperature of the circuit after being in continuous operation for a specified period of time, and so forth.

Alternatively, non-linear regression modeling techniques may be used in place of the linear regression modeling techniques. The simulated amplifier signal gain versus operating temperature curves may exhibit non-linear behavior that may be more accurately modeled using a non-linear regression modeling technique. For example, a polynomial or a parabola may be used to fit the simulated amplifier signal gain versus operating temperature curves. Other forms of non-linear regression may include multiple regression, logistic and proportional hazards regression, and so forth.

The simulated amplifier signal gain may be used to compute the gain slope ($\alpha_k$) and the reference gain point ($g_{k,ref}$) for each gain setting at reference temperature $T_{ref}$. Table 1 below displays the computed gain slope and reference gain point for the CTA 217 of the receiver 205 for three different process models, wherein the CTA 217 has 14 different gain settings.

TABLE 1

Gain Slope and Gain Reference for CTA of ABE Using Simulated Gain Data.

| Gain Setting | Strong | | Nominal | | Weak | |
| --- | --- | --- | --- | --- | --- | --- |
| (k) | $\alpha_k$ | $g_{k,ref}$ | $\alpha_k$ | $g_{k,ref}$ | $\alpha_k$ | $g_{k,ref}$ |
| 1 | −0.0098 | 34.6662 | −0.0129 | 30.9388 | −0.0152 | 25.5994 |
| 2 | −0.0134 | 31.9004 | −0.0165 | 27.6172 | −0.0188 | 21.8697 |
| 3 | −0.0158 | 28.9898 | −0.0188 | 24.3140 | −0.0207 | 18.3049 |
| 4 | −0.0182 | 26.1793 | −0.0201 | 21.2374 | −0.0219 | 15.1496 |
| 5 | −0.0152 | 23.0994 | −0.0176 | 18.2473 | −0.0193 | 12.2250 |
| 6 | −0.0134 | 19.9004 | −0.0157 | 15.1228 | −0.0173 | 9.1245 |
| 7 | −0.0079 | 16.8949 | −0.0096 | 12.5118 | −0.0107 | 6.8106 |
| 8 | −0.0114 | 14.1930 | −0.0131 | 9.1902 | −0.0142 | 3.0711 |
| 9 | −0.0143 | 11.2757 | −0.0154 | 5.8871 | −0.0162 | −0.4722 |
| 10 | −0.0159 | 8.4255 | −0.0168 | 2.8105 | −0.0172 | −3.6498 |
| 11 | −0.0168 | 6.5059 | −0.0173 | 0.8004 | −0.0176 | −5.6764 |
| 12 | −0.0174 | 4.3883 | −0.0177 | −1.3563 | −0.0178 | −7.8111 |
| 13 | −0.0115 | 0.6689 | −0.0132 | −4.1291 | −0.0144 | −10.0019 |
| 14 | −0.0113 | −1.6944 | −0.0130 | −6.4982 | −0.0139 | −12.3814 |
| Mean $\alpha$ | −0.0137 | | −0.0156 | | −0.0168 | |
| Std. Dev. $\alpha$ | 0.0030 | | 0.0029 | | 0.0030 | |

The value of $\alpha_k$ may change with the process model used in simulation. The table above illustrates the value of $\alpha_k$ using a linear regression model. The value of $\alpha_k$ changes by about 20% over the process extremes.

FIG. 5a illustrates a high-level view of a sequence of events 500 in the computing of amplifier circuit gain data. The sequence of events 500 illustrates the computing of amplifier circuit gain data utilizing measurements of actual amplifier circuits during a manufacture of a device containing the amplifier circuit. The computing of amplifier circuit gain data may begin with a reading of an operating temperature of the amplifier circuit, which may be provided by a temperature sensor located in or near the amplifier circuit (block 505). The operating temperature may be used as a calibration reference temperature, $T_{calref}$. After measuring the operating temperature of the amplifier circuit, the amplifier circuit may be set to an initial gain setting (e.g., a starting point) (block 507) and a signal gain of the amplifier circuit $g_{calref}(T_{calref})$) may be measured after a test signal of known magnitude has been applied to an input of the amplifier circuit (block 509). Alternatively, rather than applying a test signal of known magnitude to the input of the amplifier circuit, the amplifier circuit may be capable of creating a signal of known magnitude at its input.

After the signal gain of the amplifier circuit has been measured for the initial gain setting, the signal gain of the amplifier circuit may be measured for remaining gain settings (block 511). Then, using the measured signal gains of the amplifier circuit for all gain settings, a gain slope ($\alpha_k$) for process model for each gain setting may be computed (block 513). The gain slope may be computed from a device model(s) of the manufacturing process used to manufacture the amplifier circuit and may be augmented and/or verified using the measured amplifier circuit signal gain at the operating temperature. For example, the computation of the gain slope for gain setting k from a weak corner and a strong corner process models may be expressed as:

$$\alpha_k = \alpha_{k,weak} + \frac{(\alpha_{k,strong} - \alpha_{k,weak})}{[g_{k,strong}(T_{calref}) - g_{k,weak}(T_{calref})]}[g_{k,calref}(T_{calref}) - g_{k,weak}(T_{calref})].$$

The computation of the gain slope may be performed for each gain setting (block 513) and may then be stored in a memory, such as the memory 125 (block 515).

If measured amplifier circuit signal gain data are to be used rather than the simulated amplifier circuit signal gain data, then the measured amplifier circuit signal gain for each gain setting may be used to compute the gain slope ($\alpha_k$), wherein the computation may be expressed as:

$$\alpha_k = \alpha_{k,M\_weak} + \frac{(\alpha_{k,M\_strong} - \alpha_{k,M\_weak})}{[g_{k,M\_strong}(T_{calref}) - g_{k,M\_weak}(T_{calref})]}[g_{k,calref}(T_{calref}) - g_{k,M\_weak}(T_{calref})]$$

where $g_k$ is an amplifier signal gain for gain setting k at temperature T, $\alpha_{k,M\_weak}$ is a measured gain slope for the amplifier circuit manufactured using a weak process, $\alpha_{k,M\_strong}$ is a measured gain slope for the amplifier circuit manufactured using a strong process, $g_{k,M\_strong}$ is a measured amplifier signal gain for gain setting k for the amplifier circuit manufactured using a strong process, $g_{k,M\_weak}$ is a measured amplifier signal gain for gain setting k for the amplifier circuit manufactured using a weak process, $g_{k,ref}$ is a reference gain point for gain setting k measured at reference temperature $T_{ref}$. The computed gain slope may then be saved to the memory 125.

FIG. 5b illustrates a detailed view of a sequence of events 550 in the computing of amplifier circuit gain data for the receiver 205. As discussed previously, a majority of receivers, such as the receiver 205, may be partitioned into two amplifier circuits, an AFE, such as the AFE 210, and an ABE, such as the ABE 215. The computing of amplifier circuit gain data for the receiver 205 may begin with a reading of the operating temperature (block 505). The operating temperature may be detected by the temperature sensor 120. The temperature sensor 120 may be located in the receiver 205, in an electronic device that also contains the receiver 205, attached to the electronic device containing the receiver 205, and so on.

As discussed earlier, the ABE 215 of the receiver 205 may be able to generate its own test signal at a specified magnitude. Therefore, it may be a good starting point to measure the signal gain of the signal amplifiers contained in the ABE 215, namely the CTA 217. The measurement of the signal gain of the signal amplifiers in the ABE 215 may begin with a setting of the ABE 215 to an initial gain setting (block 555), once the ABE 215 has been set to the initial gain setting, the signal gain of the ABE 215 may be computed (block 557).

The signal gain of the ABE 215 may be computed as follows: Let the contribution of the ABE 215 to a DC offset at an output of the receiver 205 be denoted by $D_{CTA}$. Let a test signal $D_{IN}$ injected into the input of the ABE 215 and measured at the output of the receiver 205 be denoted $D_P$. If $G_{ABE\text{-}LOOP}$ is the signal gain of the ABE 215, then $D_P$ may be expressed mathematically as:

$$D_P = D_{CTA} + D_{IN} * G_{ABE\text{-}LOOP}.$$

Then, a test signal denoted $-D_{IN}$ may be injected into the input of the ABE 215 and $D_M$ (measured output of the receiver 205 due to $-D_{IN}$) may be expressed mathematically as:

$$D_M = D_{CTA} - D_{IN} * G_{ABE\text{-}LOOP}.$$

Then, the gain of the ABE 215, $G_{ABE\text{-}LOOP}$, may be computed mathematically using expression:

$$G_{ABE\text{-}LOOP} = (D_P - D_M) / 2D_{IN}.$$

In addition to the injection of DC signals, sinusoidal test signals may be injected. Then, it may be possible to measure a signal excursion, i.e., a maximum and a minimum value of a signal, using a max/min detector after anti-aliasing filters following an analog-to-digital conversion to determine a mean value and a peak-to-peak value of the signal. The use of a sinusoidal test signal may be an alternative approach to DC test signals, since sinusoidal injection may be a preferred method for compensating for pole frequency shifts. If the amplifier circuit contains embedded filtering, then DC test signal injection may be a preferred approach since DC signals may not be impacted by the filtering.

The signal gain for the ABE 215 at other gain settings may also be computed by repeating the setting of the gain settings of the ABE 215 and measuring the resulting signal gain (block 559). With the signal gain measured for all gain settings of the ABE 215, gain slopes for the various gain settings of the ABE 215 may be computed (block 561).

Since the signal gain of the AFE 210 of the receiver 205 may not be directly measured, it may be necessary to measure the signal gain of the ABE 215 and compute the signal gain of the AFE 210 from the measured signal gain of the ABE 215. To simplify computation, the ABE 215 should be set to a known gain setting, referred to as a reference point (block 563). With the ABE 215 providing a known amount of signal gain, the signal gain of the AFE 210 may be readily computed from the measured signal gain at an output of the ABE 215. After setting the ABE 215 to the reference point, a test signal with a specified magnitude may be applied to an input of the AFE 210 (block 565) and the AFE 210 may be set to an initial gain setting (block 567). The signal gain of the AFE 210 may then be computed by measuring a signal gain at the output of the ABE 215 and then subtracting the signal gain of the ABE 210 from the measured signal gain at the output of the ABE 215 (block 569). The signal gain for the AFE 210 at other gain settings may also be measured by repeating the setting of the gain settings of the AFE 210, measuring the resulting signal gain at the output of the ABE 215, and computing the signal gain of the AFE 210 (block 571).

Using the computed signal gain of the AFE 210, the gain slopes for the AFE 210 at various gain settings may be computed (block 573) and stored in the memory 125 along with the gain slopes for the ABE 215 at various gain settings (block 575). Table 2 displays gain slopes and reference gain points for various gain settings of the LNA 212 and TA 214 in the AFE 210, wherein the LNA 212 has eight different gain settings and the TA 214 has four different gain settings.

TABLE 2

Gain Slope and Slope Reference for AFE using Simulated Signal Gain Data.

| Gain Setting | Strong | | Nominal | | WEAK | |
|---|---|---|---|---|---|---|
| LNA, TA | $\alpha_k$ | $g_{ref,k}$ | $\alpha_k$ | $g_{ref,k}$ | $\alpha_k$ | $g_{ref,k}$ |
| 1, 1 | −0.0300 | 41.5489 | −0.0304 | 39.3109 | −0.0276 | 36.3109 |
| 1, 2 | −0.0312 | 40.4298 | −0.0310 | 38.0652 | −0.0282 | 35.0655 |
| 1, 3 | −0.0306 | 38.7394 | −0.0304 | 36.3109 | −0.0282 | 33.3293 |
| 1, 4 | −0.0306 | 36.3394 | −0.0310 | 33.9652 | −0.0282 | 30.9293 |
| 2, 1 | −0.0300 | 39.6644 | −0.0304 | 37.4273 | −0.0276 | 34.4886 |
| 2, 2 | −0.0313 | 38.5452 | −0.0310 | 36.1816 | −0.0282 | 33.1791 |
| 2, 3 | −0.0307 | 36.8548 | −0.0304 | 34.4273 | −0.0282 | 31.4429 |
| 2, 4 | −0.0307 | 34.4548 | −0.0310 | 32.0816 | −0.0282 | 29.0429 |
| 3, 1 | −0.0300 | 37.4689 | −0.0304 | 35.2373 | −0.0275 | 32.2906 |
| 3, 2 | −0.0312 | 36.3498 | −0.0310 | 33.9916 | −0.0281 | 30.9810 |
| 3, 3 | −0.0306 | 34.6594 | −0.0304 | 32.2373 | −0.0280 | 29.2449 |
| 3, 4 | −0.0306 | 32.2594 | −0.0310 | 29.8916 | −0.0280 | 26.8449 |
| 4, 1 | −0.0300 | 34.8244 | −0.0304 | 32.5919 | −0.0275 | 29.6406 |
| 4, 2 | −0.0313 | 33.7052 | −0.0309 | 31.3462 | −0.0281 | 28.3310 |
| 4, 3 | −0.0307 | 32.0148 | −0.0304 | 29.5919 | −0.0280 | 26.5949 |
| 4, 4 | −0.0307 | 29.6148 | −0.0309 | 27.2462 | −0.0280 | 24.1949 |
| 5, 1 | −0.0301 | 21.3588 | −0.0305 | 19.1318 | −0.0276 | 16.1686 |
| 5, 2 | −0.0314 | 20.2397 | −0.0311 | 17.8861 | −0.0282 | 14.8591 |
| 5, 3 | −0.0308 | 18.5493 | −0.0305 | 16.1318 | −0.0282 | 13.1229 |
| 5, 4 | −0.0308 | 16.1493 | −0.0311 | 13.7861 | −0.0282 | 10.7229 |
| 6, 1 | −0.0303 | 17.8069 | −0.0306 | 15.5808 | −0.0277 | 12.6231 |
| 6, 2 | −0.0315 | 16.6878 | −0.0312 | 14.3351 | −0.0284 | 11.3135 |
| 6, 3 | −0.0309 | 14.9974 | −0.0306 | 12.5808 | −0.0283 | 9.5774 |
| 6, 4 | −0.0309 | 12.5974 | −0.0312 | 10.2351 | −0.0283 | 7.1774 |
| 7, 1 | −0.0304 | 11.7078 | −0.0306 | 9.4963 | −0.0277 | 6.5431 |
| 7, 2 | −0.0317 | 10.5886 | −0.0312 | 8.2505 | −0.0284 | 5.2335 |
| 7, 3 | −0.0310 | 8.8982 | −0.0306 | 6.4963 | −0.0283 | 3.4974 |
| 7, 4 | −0.0310 | 6.4982 | −0.0312 | 4.1505 | −0.0283 | 1.0974 |
| 8, 1 | −0.0302 | 5.6915 | −0.0304 | 3.5319 | −0.0273 | 0.6252 |
| 8, 2 | −0.0315 | 4.5724 | −0.0309 | 2.2862 | −0.0279 | −0.6843 |
| 8, 3 | −0.0308 | 2.8819 | −0.0304 | 0.5319 | −0.0278 | −2.4205 |
| 8, 4 | −0.0308 | 0.4819 | −0.0309 | −1.8138 | −0.0278 | −4.8205 |
| Mean α | −0.0308 | | −0.0307 | | −0.0280 | |
| Std. Dev. α | 0.0005 | | 0.0003 | | 0.0003 | |

FIG. 6a illustrates a high-level view of a sequence of events 600 in the compensation of signal gain for an amplifier circuit. The computing of the amplifier circuit gain data may be performed during a calibration of the amplifier circuit or a device containing the amplifier circuit and then stored in a memory. When the amplifier circuit is in normal operation, the amplifier gain data may then be used to compensate for variations in signal gain of the amplifier circuit.

The compensation of the signal gain of the amplifier circuit may be performed due to the occurrence of one or more events. For example, the compensation may be performed at specified times, such as when the amplifier circuit is powered on or has been powered on for a specified period of time. Alternatively, the compensation may occur when there has been a detected change in an operating temperature of the amplifier circuit. The compensation may also be performed when instructed to do so, such as when a digital gain variation control circuit (for example, the digital gain variation control circuit 110) receives a command to compensate for signal gain variation if needed. Furthermore, the digital gain variation control circuit 110 may be configured to automatically perform a compensation of the signal gain whenever the amplifier circuit may be used. For example, the digital gain variation control circuit 110 may automatically perform a compensation of the signal gain of a receiver in an electronic device whenever a corresponding transmitter transmits data.

The compensation of the signal gain may begin when the digital gain variation control circuit 110 receives a signal gain control command (block 605). As discussed previously, the digital gain variation control circuit 110 may receive such a command due to the occurrence of one or more events. The signal gain control command may instruct the digital gain variation control circuit 110 to provide signal gain compensation for the amplifier circuit if needed. After the signal gain control command has been received, the gain control circuit 115 of the digital gain variation control circuit 110 may determine a desired signal gain for the amplifier circuit (block 607). Additionally, an operating temperature of the amplifier circuit may be determined (block 609). The operating temperature of the amplifier circuit may be determined by reading sensor information from the temperature sensor 120.

The operating temperature of the amplifier circuit may be used to create a table of adjusted signal gains for the amplifier circuit at the various gain settings of the amplifier circuit (block 611). In general, the computed amplifier circuit gain data may be stored in the form of a gain slope ($\alpha_k$) and a reference gain ($g_{k,ref}$) for each gain setting. The adjusted signal gains may be computed from the gain slope ($\alpha_k$) and a reference gain ($g_{k,ref}$) using a linear regression model. For example, the adjust signal gain for gain setting k may be computed using expression:

$$g_{k,T} = g_{k,ref} + \alpha_k^*(T - T_{ref}),$$

where T is the operating temperature of the amplifier circuit, $T_{ref}$ is the reference temperature.

After creating the table of adjusted signal gains, the desired signal gain may be compared to the adjusted signal gains to determine a gain setting for the amplifier circuit (block 612). If the desired signal gain does not match within a permissible error window to one of the adjusted signal gains, then a gain setting that may produce a signal gain that is closest to the desired signal gain may be selected. After the gain setting has been selected, the gain setting may be applied to the amplifier circuit (block 614) and then the signal gain of the amplifier circuit may be measured (block 616) to verify the proper amount of signal gain has been achieved.

FIG. 6b illustrates a detailed view of a sequence of events 650 in the compensation of signal gain for the receiver 205. As discussed previously, the receiver 205 may be partitioned into two amplifier circuits, the AFE 210 and the ABE 215. Both amplifier circuits may need to have their signal gain compensated due to changes in operating temperature. The compensation of signal gain for the receiver 205 may begin with a receipt of a signal gain control command by the digital gain variation control circuit 110 (block 605). After the signal gain control command has been received, the gain control circuit 115 of the digital gain variation control circuit 110 may determine a desired signal gain for the ABE 215 (block 655). As discussed previously, the ABE 215 may be able to generate its own test signal as well as the signal output of the ABE 215 may be directly observed. Therefore, it may be preferred to compensate for the signal gain of the ABE 215 prior to compensating for the signal gain of the AFE 210.

Additionally, an operating temperature of the AFE 215 may be determined (block 657). The operating temperature of the amplifier circuit may be determined by reading sensor information from the ABE 215. The operating temperature of the ABE 215 may be used to create a table of adjusted signal gains for the ABE 215 at the various gain settings of the ABE 215 (block 659). In general, the computed ABE 215 gain data may be stored in the form of a gain slope ($\alpha_k$) and a reference gain ($g_{k,ref}$) for each gain setting. The adjusted signal gains may be computed from the gain slope ($\alpha_k$) and a reference gain ($g_{k,ref}$) using a linear regression model. For example, the adjust signal gain for gain setting k may be computed using expression:

$$g_{k,T} = g_{k,ref} + \alpha_k^*(T - T_{ref}),$$

where T is the operating temperature of the ABE 215, $T_{ref}$ is the reference temperature. Similarly, a table of adjust signal gains for the AFE 210 at various gain settings of the AFE 210 may also be computed (block 661).

After creating the table of adjusted signal gains for the ABE 215 and the AFE 210, the desired signal gain for the ABE 215 may be compared to the adjusted signal gains of the ABE 215 to determine a gain setting for the ABE 215 (block 663). If the desired signal gain does not match within a permissible error window to one of the adjusted signal gains, then a gain setting that may produce a signal gain that is closest to the desired signal gain may be selected. After the gain setting has been selected, the gain setting may be applied to the ABE 215 (block 665) and then the signal gain of the ABE 215 may be measured (block 667) to verify the proper amount of signal gain for the ABE 215 has been achieved.

A desired gain for the AFE 210 may then be computed (block 669). Since the signal gain of the AFE 210 may not be directly observable in the receiver 205, it may be necessary to compute a total signal gain for both the AFE 210 and the ABE 215, with the ABE 215 set to a known signal gain. Then, the desired signal gain for the AFE 210 may be compared to the adjusted signal gains of the AFE 210 to determine a gain setting for the AFE 210 (block 671). If the desired signal gain does not match within a permissible error window to one of the adjusted signal gains, then a gain setting that may produce a signal gain that is closest to the desired signal gain may be selected. After the gain setting has been selected, the gain setting may be applied to the AFE 210 (block 673) and then the signal gain of the AFE 210 may be measured by measuring the signal gain of both the AFE 210 and the ABE 215 and then adjusting the measured signal gain for the known ABE 215 signal gain (block 675) to verify the proper amount of signal gain for the AFE 210 has been achieved.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for calibrating a signal gain of an amplifier circuit, the method comprising:
   determining an operating temperature of the amplifier circuit;
   setting the amplifier circuit to an initial gain setting;
   determining an initial signal gain of the amplifier;

repeating the setting and the determining of a signal gain for remaining gain settings of the amplifier circuit to determine a signal gain for each gain setting; and computing a gain slope for each gain setting, wherein for each gain setting, the computing comprises fitting a curve through the signal gain and a reference signal gain associated with the gain setting, and computing the gain slope from the curve, and wherein the curve comprises a line described as $$g_k = g_{k,ref} + \alpha_k(T - T_{ref}),$$

where $g_k$ is an amplifier signal gain for gain setting k at temperature T, $g_{k,ref}$ is a reference gain point for gain setting k, $T_{ref}$ is a reference temperature, and $\alpha_k$ is a slope of the amplifier signal gain with respect to temperature.

2. The method of claim 1, wherein the determining of the operating temperature comprises reading a value provided by a temperature sensor disposed on a same circuit board as the amplifier circuit.

3. The method of claim 1, wherein the reference gain point ($g_{k,ref}$) for gain setting k at the reference temperature ($T_{ref}$) and is computed from device models of the amplifier circuit.

4. The method of claim 1, further comprising, after the computing, saving the gain slope for each gain setting to a memory.

5. The method of claim 1, wherein the amplifier circuit comprises a plurality of amplifier circuits, and wherein the setting, the determining of a signal gain, the repeating, and the computing is performed for each amplifier circuit in the plurality of amplifier circuits.

6. The method of claim 5, further comprising after the computing of the gain slope for each gain setting of a second amplifier circuit in the plurality of amplifier circuits, setting the second amplifier circuit to a specified gain setting.

7. A method for compensating a signal gain of an amplifier circuit, the method comprising:

determining a desired gain for the amplifier circuit;

determining an operating temperature of the amplifier circuit;

adjusting a set of signal gains based on the operating temperature to produce a set of adjusted signal gains;

determining a desired gain setting based on the desired gain and the set of adjusted signal gains, wherein determining of the desired gain setting comprises selecting a gain setting from the set of adjusted signal gains that results in the amplifier circuit producing a produced signal gain closest to the desired signal gain; and providing the desired gain setting to the amplifier circuit.

8. The method of claim 7, further comprising, prior to determining the desired gain, receiving a gain control command.

9. The method of claim 8, wherein the determining of the desired gain comprises extracting the desired gain from the gain control command.

10. The method of claim 7, wherein the adjusting of the set of signal gains comprises:

retrieving a gain slope, a reference gain point, and a reference temperature associated with a gain setting;

computing an adjusted signal gain based on the gain slope, the reference gain point, the operating temperature, and the reference temperature; and repeating the retrieving and the computing of the adjusted signal gain for remaining gain settings.

11. The method of claim 10, wherein the computing comprises, solving equation $$g_k = g_{k,ref} + \alpha_k(T - T_{ref}),$$

where $g_k$ is the adjusted signal gain for the amplifier circuit at gain setting k at the operating temperature T, $g_{k,ref}$ is the reference gain point for gain setting k, $T_{ref}$ is the reference temperature, and $\alpha_k$ is the slope of the signal gain with respect to temperature.

12. The method of claim 10, wherein the gain slope and the reference gain point associated with a gain setting at the reference temperature are computed from device models of the amplifier circuit or are measured during a calibration of the amplifier circuit.

13. The method of claim 7, wherein the amplifier circuit comprises a plurality of amplifier circuits arranged in a sequence, and wherein the determining of the desired gain setting and the providing of the desired gain setting begins with a first amplifier circuit located at a first end of the plurality of amplifier circuits and continues one amplifier circuit at a time towards a second end of the plurality of amplifier circuits.

14. The method of claim 13, wherein, after the determining of the desired gain setting and the providing of the desired gain setting is complete for the first amplifier circuit, the gain setting of the first amplifier circuit is not further adjusted until a second desired gain is determined.

15. The method of claim 7, further comprising, after the providing:

measuring a signal gain of the amplifier circuit; and repeating the adjusting, the determining of the desired gain setting, and the providing in response to a determining that the signal gain is not substantially equal to the desired gain.

16. A circuit with signal gain compensation, the circuit comprising:

a temperature sensor to provide an operating temperature of the circuit;

an amplifier circuit to amplify a signal provided by a signal input by an amount controllable by a control input;

a gain control circuit coupled to the amplifier circuit and to the temperature sensor, the gain control circuit configured to compensate for changes in a signal amplification factor of the amplifier due to changes in operating temperature using adjusted signal amplification factor data based on the operating temperature and signal amplification factor data generated during calibration of the circuit; and a memory coupled to the gain control circuit, the memory to store the signal amplification factor data and the adjusted signal amplification factor data, wherein the circuit is a wireless radio receiver, and wherein the amplifier circuit comprises two amplifier circuits, an analog-front-end (AFE) and an analog-back-end (ABE), and wherein the gain control circuit compensates the signal amplification factor of the ABE and then the signal amplification factor of the AFE.

17. A method for calibrating a signal gain of an amplifier circuit, the method comprising:

determining an operating temperature of the amplifier circuit;

setting the amplifier circuit to an initial gain setting;

determining an initial signal gain of the amplifier;

repeating the setting and the determining of a signal gain for remaining gain settings of the amplifier circuit to determine a signal gain for each gain setting; and computing a gain slope for each gain setting, wherein the amplifier circuit comprises a plurality of amplifier circuits, and wherein the setting, the determining of a signal gain, the repeating, and the computing is performed for each amplifier circuit in the plurality of amplifier circuits.

18. The method of claim 17, wherein the determining of the operating temperature comprises reading a value provided by a temperature sensor disposed on a same circuit board as the amplifier circuit.

19. The method of claim 17, wherein the computing comprises for each gain setting:

fitting a curve through the signal gain and a reference signal gain associated with the gain setting; and computing the gain slope from the curve.

20. The method of claim 17, further comprising after the computing of the gain slope for each gain setting of a second amplifier circuit in the plurality of amplifier circuits, setting the second amplifier circuit to a specified gain setting.

* * * * *